(12) United States Patent
Fang et al.

(10) Patent No.: US 7,223,156 B2
(45) Date of Patent: May 29, 2007

(54) METHOD CHEMICAL-MECHANICAL POLISHING AND PLANARIZING CORUNDUM, GAAS, GAP AND GAAS/GAP ALLOY SURFACES

(75) Inventors: Mingming Fang, Naperville, IL (US); Michael R. Ianiro, Pottstown, PA (US); Don Eisenhour, Grayslake, IL (US)

(73) Assignee: AMCOL International Corporation, Arlington Heights, IL (US)

( * ) Notice: Subject to any disclaimer, the term of this patent is extended or adjusted under 35 U.S.C. 154(b) by 178 days.

(21) Appl. No.: 11/131,962

(22) Filed: May 18, 2005

(65) Prior Publication Data

US 2005/0233680 A1    Oct. 20, 2005

Related U.S. Application Data

(63) Continuation-in-part of application No. 10/867,337, filed on Jun. 14, 2004, now Pat. No. 7,112,123, and a continuation-in-part of application No. 10/713,709, filed on Nov. 14, 2003.

(51) Int. Cl.
*B24B 1/00*    (2006.01)

(52) U.S. Cl. .......................................... 451/41; 451/28

(58) Field of Classification Search ................... 451/41, 451/28, 285–289
See application file for complete search history.

(56) References Cited

U.S. PATENT DOCUMENTS

| | | | |
|---|---|---|---|
| 5,340,370 A | 8/1994 | Cadien et al. | |
| 5,527,423 A | 6/1996 | Neville et al. | |
| 5,622,525 A | 4/1997 | Haisma et al. | |
| 5,669,942 A | 9/1997 | McCullough | |
| 5,958,794 A | 9/1999 | Bruxvoort et al. | |
| 6,602,439 B1 | 8/2003 | Hampden-Smith et al. | |
| 7,087,529 B2* | 8/2006 | Fang et al. | 438/692 |
| 7,112,123 B2* | 9/2006 | Fang et al. | 451/41 |
| 2005/0233680 A1* | 10/2005 | Fang et al. | 451/41 |
| 2005/0277367 A1* | 12/2005 | Fang et al. | 451/41 |
| 2006/0226125 A1* | 10/2006 | Fang et al. | 216/88 |

FOREIGN PATENT DOCUMENTS

| | | |
|---|---|---|
| EP | 0 103 085 A1 | 3/1984 |
| WO | WO-02/024759 A2 | 3/2002 |
| WO | WO-03/064551 A1 | 8/2003 |
| WO | WO-2004/063301 A1 | 7/2004 |
| WO | WO-2004/083328 A2 | 9/2004 |

OTHER PUBLICATIONS

PCT International Search Report from the European Patent Office for International Patent Application No. PCT/US2004/031645 dated Jan. 3, 2005 (3 pages).

* cited by examiner

*Primary Examiner*—Lee D. Wilson
(74) *Attorney, Agent, or Firm*—Marshall Gerstein & Borun

(57) ABSTRACT

Compositions and methods for planarizing or polishing a corundum, GaAs, GaP or GaAs/GaP alloy surface, particularly a semiconductor wafer surface. The polishing compositions described herein comprise (a) a liquid carrier; (b) a smectite clay, preferably a sodium smectite clay; and optional additives, such as (c) $CeO_2$, $SiO_2$ and/or $Al_2O_3$ abrasive particles, (d) a chemical accelerator; and (e) a complexing or coupling agent capable of chemically or ionically complexing with, or coupling to, the material removed during the polishing process. The optional complexing or coupling agent carries away the removed particles, during polishing, to prevent the separated particles from returning to the surface from which they were removed. Also disclosed are methods of planarizing or polishing corundum, GaAs, GaP and GaAs/GaP alloy surfaces comprising contacting the surface with the compositions.

25 Claims, No Drawings

METHOD CHEMICAL-MECHANICAL POLISHING AND PLANARIZING CORUNDUM, GAAS, GAP AND GAAS/GAP ALLOY SURFACES

CROSS REFERENCE TO RELATED APPLICATIONS

This application is a continuation-in-part of U.S. patent application Ser. No. 10/867,337 filed Jun. 14, 2004 now U.S. Pat. No. 7,112,123; and Ser. No. 10/713,709 filed Nov. 14, 2003.

TECHNICAL FIELD

The present invention is directed to a clay-containing abrasive composition and method of planarizing or polishing corundum, GaAs, GaP and GaAs/GaP alloy surfaces. The composition is used as a clay-containing, preferably a sodium smectite clay-containing, aqueous slurry, particularly useful in the polishing of corundum, such as semiprecious stones, such as sapphires and rubies, and in the manufacture of semiconductor devices, (e.g., integrated circuits, wafers) lasers, and light-emission-diode (LED) devices.

BACKGROUND

Compositions for planarizing or polishing the surface of a substrate are well known in the art. Polishing slurries typically contain an abrasive material in an aqueous solution and are applied to a surface by contacting the surface with a polishing pad saturated with the slurry composition. Typical abrasive materials include silicon dioxide, cerium oxide, aluminum oxide, zirconium oxide, and tin oxide. U.S. Pat. No. 5,527,423, for example, describes a method for chemically-mechanically polishing a metal layer by contacting the surface with a polishing slurry comprising high purity fine metal oxide particles in an aqueous medium.

Conventional polishing compositions typically are not entirely satisfactory at polishing and/or planarizing corundum (crystalline $Al_2O_3$), including artificial and natural sapphires and rubies, particularly those used for laser and light-emitting diode (LED) applications, or at polishing and/or planarizing GaAs, GaP and GaAs/GaP alloys. In particular, polishing slurries can have less than desirable polishing rates, and their use in chemically-mechanically polishing semiconductor surfaces can result in poor surface quality. Because the performance of a semiconductor wafer is directly associated with the planarity of its surface, it is crucial to use a polishing composition that has a high polishing efficiency, uniformity, and removal rate and leaves a high quality polish with minimal surface defects.

The difficulty in creating an effective polishing composition for corundum, GaAs, GaP and GaAs/GaP alloys, particularly colorless sapphire wafers that have been artificially synthesized for laser and LED applications stems from the complexity of balancing polishing efficiency and surface quality. The corundum, GaAs, GaP and GaAs/GaP alloy wafers used in laser and semiconductor industry need to be polished smoothly and defect-free at the nanoscale level for their application. It has been a continuous challenge for manufacturers to achieve the required surface smoothness at an economical rate.

There have been many attempts to improve the polishing efficiency and uniformity of conventional polishing agents, while minimizing defects in the polished surface and damage to underlying structures or topography. For example, U.S. Pat. No. 5,340,370 describes a polishing composition comprising an abrasive, an oxidizing agent, and water, which purportedly yields an improved removal rate and polishing efficiency. Similarly, U.S. Pat. No. 5,622,525 describes a polishing composition comprising colloidal silica having an average particle size of 20-50 nm, a chemical activator, and demineralized water.

A need remains, however, for compositions and methods that will exhibit desirable planarization efficiency, uniformity, and removal rate during the polishing and planarization of substrates, particularly corundum, GaAs, GaP and GaAs/GaP alloy semiconductor wafer surfaces, while minimizing defects, such as surface imperfections and damage to underlying structures and topography during polishing and planarization.

BRIEF SUMMARY

Disclosed are compositions and methods for planarizing or polishing corundum, GaAs, GaP and GaAs/GaP alloy surfaces, particularly a semiconductor wafer surface. The polishing compositions in one embodiment described herein comprise (a) a liquid carrier, preferably water; (b) a clay abrasive, preferably a sodium smectite clay; and optional additives, such as (c) $CeO_2$, silica ($SiO_2$) and/or alumina ($Al_2O_3$) abrasive particles; (d) a chemical accelerator; and (e) a complexing or coupling agent capable of chemically or ionically complexing with, or coupling to, the insulating material removed during the polishing process. The optional complexing or coupling agent carries away the removed material during polishing, to prevent the separated particles from returning to the surface from which they were removed. Also disclosed are methods of planarizing or polishing a corundum, GaAs, GaP and GaAs/GaP alloy surface comprising contacting the surface with the compositions described herein.

Ranges may be expressed herein as from "about" or "approximately" one particular value and/or to "about" or "approximately" another particular value. When such a range is expressed, another embodiment includes from the one particular value and/or to the other particular value. Similarly, when values are expressed as approximations, by use of the antecedent "about," it will be understood that the particular value forms another embodiment.

Another aspect is to provide a sodium-containing clay method for planarizing or polishing corundum, GaAs, GaP and GaAs/GaP alloy surfaces that use sodium-containing clay particles that act as abrasive particles and also as a dispersing agent for maintaining a homogenous abrasive composition.

Still another aspect of the compositions and methods described herein is to provide sodium-containing clay abrasive particles, in a water/clay particle slurry having clay abrasive particles dispersed throughout the water and having a particle size such that at least 90% of the clay particles (by number) have a mean particle size in the range of 0.002 μm to 10 μm, preferably 0.02 μm to 5 μm, more preferably such that at least 90% of the particles have a mean particle size of 0.1 μm to 4 μm, to provide a slurry capable of planarizing metal and/or insulator surfaces.

Another aspect of the compositions and methods described herein is to provide a planarizing composition that comprises an aqueous slurry of clay abrasive particles in an amount of about 0.05 to about 40 wt. %, preferably about 0.1 wt. % to about 20 wt. %, more preferably about 0.1 wt. % to about 5 wt. %, of the slurry; an oxidizing agent accelerator in an amount of 0.01 wt. % to about 20 wt. % of the slurry, preferably about 0.1% to about 5 wt. %, and a chelating agent or complexing agent in an amount of about 0.1 wt. % to about 20 wt. %, preferably about 0.2 wt. % to about 5 wt. %, more preferably about 0.5 to about 2 wt. %, e.g., 1 wt. %.

Another aspect of another embodiment of the compositions and methods described herein is to provide a method for planarizing or polishing corundum, GaAs, GaP and GaAs/GaP alloy surfaces using a combination of sodium clay and optionally other abrasive particles, such as $CeO_2$, $SiO_2$, and/or $Al_2O_3$ particles as abrasive particles.

Another aspect of the clay and other abrasive embodiment of the compositions and methods described herein is to provide a mixture of clay and other abrasive particles, in a water/clay/other abrasive particle slurry having clay and $CeO_2$, $SiO_2$ and/or $Al_2O_3$ abrasive particles dispersed throughout the water. The particle size of the $CeO_2$, $SiO_2$ and/or $Al_2O_3$ abrasive particles should be in the range of larger than about 0.1 μm to about 10 μm, preferably at least about 0.2 μm to about 5 μm. More preferably, the particle size of the $CeO_2$, $SiO_2$ and/or $Al_2O_3$ abrasive particles are such that at least 90% of the particles (by number) have a mean particle size in the range of larger than about 0.1 μm to about 5 μm, most preferably at least about 0.2 μm to about 4 μm, to provide a slurry capable of planarizing glass, and/or insulator surfaces.

The above and other aspects and advantages of the compositions and methods described herein will become more apparent from the following description of the preferred embodiments, taken in conjunction with the drawings.

DESCRIPTION OF THE PREFERRED EMBODIMENTS

The polishing compositions comprise (a) a liquid carrier; (b) purified clay; and optional additives, such as (c) $CeO_2$, $SiO_2$ and/or $Al_2O_3$ abrasive materials; (d) a chemical accelerator; and (e) a complexing or coupling agent capable of chemically or ionically complexing with, or coupling to, the removed corundum, GaAs, GaP and GaAs/GaP alloy material being planarized. The compositions are useful in planarizing or polishing corundum, GaAs, GaP and GaAs/GaP alloy surfaces. The compositions provide for high polishing efficiency, uniformity, and removal rate of a surface, with minimal defects, such as field loss of underlying structures and topography.

The total solids can be present in any suitable concentration in the compositions described herein. The solids desirably are present in a concentration of about 0.1 wt. % or more (e.g., about 0.1-40 wt. %). Preferably, the total solids concentration is about 0.1-30 wt. % of the composition.

The abrasive particles of the compositions described herein comprise a smectite clay, preferably a sodium smectite clay, that may be dioctahedral and/or trioctahedral smectite clays. Suitable dioctahedral and trioctahedral smectite clays include the following:

Dioctahedral: Beidellite; montmorillonite; Nontronite; and Volkonskoite.

Trioctahedral: Saponite; and Hectorite.

Other clays that are useful as abrasive particles include both natural and synthetic clays, such as the following: Kaolinite clays, such as Halloysite and Kaolin clays; Serpentine clays, such as Lizardite clays, Amesite clays and Chrysotile clays; Pyrophyllite clay ($Al_2Si_4O_{10}(OH)_2$); Talc; Micas, such as Illite and Vermiculite; and any synthetic clays, including synthetic smectites, Laponite, and any other synthetic clay in any of the above clay groups and subgroups:

Optionally, an oxidizing component can be incorporated into the polishing composition to promote oxidation of a metal layer to its corresponding oxide. For example, an oxidizing component can be used to oxidize tungsten to tungsten oxide; thereafter, the tungsten oxide can be chemically and/or mechanically polished and removed. As a further example, the oxidizing component can oxidize copper to cuprous oxide or cupric oxide for more efficient removal and better planarization. Preferred oxidizing components include oxidizing salts, oxidizing metal complexes, iron salts, such as nitrates, sulfates, potassium ferri-cyanide and the like, aluminum salts, quaternary ammonium salts, phosphonium salts, peroxides, chlorates, perchlorates, permanganates, persulfates and mixtures thereof. Other suitable oxidizers can include, for example, oxidized halides (e.g., chlorates, bromates, iodates, perchlorates, perbromates, periodates, mixtures thereof, and the like). Suitable oxidizers also can include, for example, perboric acid, perborates, percarbonates, nitrates, persulfates, peroxides, e.g., hydrogen peroxide, peroxyacids (e.g., peracetic acid, perbenzoic acid, m-chloroperbenzoic acid, salts thereof, mixtures thereof, and the like), permanganates, chromates, cerium compounds, ferricyanides (e.g., potassium ferricynaide), mixtures thereof, and the like. The amount should be sufficient to ensure rapid oxidation of the metal layer while balancing the mechanical and chemical polishing performance of the system.

Other possible additives include pH modifiers such as common inorganic acids, such as HCl, $HNO_3$ and bases, such as NaOH, KOH, $NH_4OH$, filters, fibers, lubricants, wetting agents, pigments, dyes, coupling agents, plasticizers, surfactants, dispersing agents, suspending agents, chelating or complexing agents, catalysts, and the like. The polishing pad matrix material can comprise up to 80 weight percent filler and other optional ingredients. Examples of optional additives include EDTA, citrates, polycarboxylic acids and the like.

Any suitable chemical accelerator can be present in the composition. The optional chemical accelerator acts to improve the planarization or polishing of a substrate, for example, as evidenced by an increased rate of substrate removal.

Suitable optional chelating or complexing agents can include, for example, glycine, carbonyl compounds (e.g., acetylacetonates, and the like), simple carboxylates (e.g., acetates, aryl carboxylates, and the like), carboxylates containing one or more hydroxyl groups (e.g., glycolates, lactates, gluconates, gallic acid and salts thereof, and the like), di-, tri-, and poly-carboxylates (e.g., oxalates, phthalates, citrates, succinates, tartrates, malates, edetates (e.g., disodium EDTA), mixtures thereof, and the like), carboxylates containing one or more sulfonic and/or phosphonic groups, and the like. Suitable chelating or complexing agents also can include, for example, di-, tri-, or poly-alcohols (e.g., ethylene glycol, procatechol, pyrogallol, tannic acid, and the like) and amine-containing compounds (e.g., amino acids, amino alcohols, di-, tri-, or poly-alcohols (e.g., ethylene glycol, pyrocatechol, pyrogallol, tannic acid, and the like) and amine-containing compounds (e.g., amino acids, amino alcohols, di-, tri-, and poly-amines, and the like). Suitable polishing accelerators also can include, for example, sulfates, halides (i.e., fluorides, chlorides, bromides, and iodides), and the like.

It will be appreciated that many of the aforementioned compounds can exist in the form of a salt (e.g., a metal salt, an ammonium salt, or the like), an acid, or as a partial salt. For example, citrates include citric acid, as well as mono-, di-, and tri-salts thereof, phthalates include phthalic acid, as well as mono-salts (e.g., potassium hydrogen phthalate) and di-salts thereof; perchlorates include the corresponding acid (e.g., perchloric acid), as well as salts thereof. Furthermore, certain compounds may perform more than one function. For example, some compounds can function both as a chelating and an oxidizing agent (e.g., certain ferric nitrates and the like).

Preferably, the optional chemical accelerator is a peroxide, such as hydrogen peroxide.

If a chemical accelerator is included in the polishing composition, any suitable amount can be used. The chemical accelerator desirably is present in the polishing composition in an amount of about 0.01-20 wt. %; preferably about 0.7 wt. % to about 10 wt. %). Preferably, a chemical accelerator is present in the composition in an amount of about 0.75 wt. % to about 5 wt. %. More preferably, a chemical accelerator is present in the composition in an amount of about 0.5 to 4 wt. %, particularly 0.8 to 2.0 wt. %.

The composition can further include one or more other components, such as surfactants, polymeric stabilizers or other surface active dispersing agents, pH adjusters, regulators, or buffers, and the like. Suitable surfactants can include, for example, cationic surfactants, anionic surfactants, nonionic surfactants, amphoteric surfactants, fluorinated surfactants, mixtures thereof, and the like. Suitable polymeric stabilizers or other surface active dispersing agents can include, for example phosphoric acid, organic acids, tin oxides, organic phosphonates, mixtures thereof, and the like. Suitable pH adjusters, regulators, or buffers can include, for example, sodium hydroxide, sodium carbonate, sulfuric acid, hydrochloric acid, nitric acid, phosphoric acid, citric acid, potassium phosphate, mixtures thereof, and the like.

Any suitable carrier (e.g., solvent) can be used in the composition of the present invention. A carrier is used to facilitate the application of the abrasive purified clay particles onto the surface of a suitable substrate. A preferred carrier is water.

The pH of the composition is maintained in a range suitable for its intended end-use. The composition desirably has a pH of about 2-12. The preferred pH will depend on the polished substrate. For example, when the substrate is corundum, then the pH preferably is about 8 to about 10, more preferably about 9 to about 10.

The method of planarizing or polishing a corundum, GaAs, GaP or GaAs/GaP alloy surface comprises contacting a surface with any of the compositions as described herein. Corundum, GaAs, GaP and GaAs/GaP alloy surfaces can be treated with the compositions described herein by any suitable technique. For example, the composition can be applied to the surface through use of a polishing pad. The rate of removal of corundum, GaAs, GaP, GaAs/GaP alloys, silicon dioxide, and/or metal is dependent on the rotational speed of the pad the downward force applied to the pad, and the flow rate of the abrasive composition, as well known in the art.

The compositions are capable of planarizing or polishing corundum, GaAs, GaP and GaAs/GaP alloy surfaces a relatively high rate. Furthermore, the compositions of the present invention are well-suited for the planarizing or polishing corundum, GaAs, GaP and GaAs/GaP alloy surfaces in hardened work pieces, such as memory or rigid disks, metals (e.g., noble metals), ILD layers, semiconductors, micro-electro-mechanical devices, ferroelectrics, and magnetic heads. The compositions also can be used in the manufacture of integrated circuits containing corundum, GaAs, GaP and GaAs/GaP alloy surfaces. The compositions described herein exhibit desirable planarization efficiency, uniformity, removal rate, and low defectivity during the polishing and planarization of substrates.

In accordance with an important feature of the compositions and methods described herein, the abrasive particles comprise at least 10% by weight, more preferably at least about 20% by weight, and up to 100% by weight, based- on the total weight of abrasive particles in the slurry composition, of a smectite clay, preferably a sodium montmorillonite clay. Suitable additional dioctahedral and trioctahedral smectite clays include Beidellite; Nontsonite; Volkonskoite; Saponite; and Hectorite. Other clays that are useful as abrasive particles include both natural and synthetic clays, such as the following: Kaolinite clays, such as Halloysite and Kaolin clays; Serpentine clays, such as Lizardite clays, Amesite clays and Chrysotile clays; Pyrophyllite clay ($Al_2Si_4O_{10}(OH)_2$); Talc; Micas, such as Illite and Vermiculite; and any synthetic clays, including synthetic smectites, Laponite, and any other synthetic clay in any of the above clay groups and subgroups.

In other embodiments, the clay is ground to a particle size such that at least 90% of the clay particles (by number) have a mean particles size in the range of 0.002 μm to 10 μm, preferably 0.02 μm to 5 μm, more preferably such that at least 90% of the particles have a mean particle size of 0.1 μm to 4 μm.

In the embodiment that includes $CeO_2$, $SiO_2$ and/or $Al_2O_3$ abrasive particles together with the smectite clay particles, these additional $CeO_2$, $SiO_2$ and/or $Al_2O_3$ particles used in the CMP slurries have particle sizes such that at least 90% of the abrasive particles (by number) have a particles size of about 10 nm to about 10 μm, more preferably about 50 nm to 5 μm, most preferably about 100 nm to about 4 μm and suspended in water, as an aqueous suspension, e.g., less than about 20% by weight clay, preferably about 1% to about 10% by weight clay, based on the total weight of clay and water.

In the $CeO_2$, $SiO_2$ and/or $Al_2O_3$ additional abrasive particle embodiments, three different kinds of ceria particles made by different manufacturers were examined. Sodium smectite clay/ceria, clay/$SiO_2$ and clay/$Al_2O_3$ CMP slurries should significantly increase the polishing rate of corundum, GaAs, GaP and GaAs/GaP alloy surfaces without sacrificing the surface roughness. The examined ceria particles have different sizes and surface charges. The mean size and surface charges of the examined ceria particles were measured at a pH of about 7, and were as follows:

TABLE 1

$CeO_2$ Abrasive Particles

| Material | Source | Zeta Potential (mV) @ 0.1% solids | Mean particle size (nm) |
|---|---|---|---|
| Ceria #1 | Nyacol DP7090 | −48 | 250 |
| Ceria #2 | Nanophase SG18R | −70 | 650 |
| Ceria #3 | Nanophase GP12D | +50 | 165 |

The invention claimed is:

1. A method of planarizing or polishing a corundum, GaAs, GaP or GaAs/GaP alloy surface with a composition comprising polishing the surface with a composition comprising (a) a liquid carrier, and (b) solids comprising about 10-100 wt. % smectite clay abrasive particles, based on the total weight of solids in the composition, said clay abrasive particles having a particle size such that at least 90% of the particles (by number), when slurried in water, have a particle size in the range of about 0.002 µm to about 10 µm.

2. The method of claim 1, wherein the clay abrasive particles are selected from sodium smectite clay, calcium smectite clay, potassium smectite clay, ammonium smectite clay or a combination thereof.

3. The method of claim 2, wherein the clay abrasive particles are a sodium smectite clay particles.

4. The method of claim 3, wherein the carrier is water.

5. The method of claim 2, further including a chemical accelerator selected from a peroxide, a sulfate, a persulfate, or a nitrate.

6. The method of claim 5, wherein a chemical accelerator is selected from the group consisting of hydrogen peroxide, ammonium persulfate, iron (III) nitrate, and hydroxylamine nitrate.

7. The method of claim 1, wherein the solids are present in the composition in an amount of about 0.1 to about 40 wt. % of the composition.

8. The method of claim 1, wherein the clay is selected from the group consisting of a smectite clay; a kaolinite clay; a serpentine clay; a Pyrophyllite clay; talc, mica, and a synthetic clay.

9. The method of claim 8, wherein the clay is a smectite clay selected from the group consisting of bentonite, montmorillonite, and combinations thereof.

10. The method of claim 1, wherein the pH of the composition is in the range of 2 to 12.

11. The method of claim 10, wherein the pH is adjusted to 2 to 12 by the addition of an inorganic acid or an inorganic base.

12. The method of claim 11, wherein the acid or base is selected from HCl, $HNO_3$, NaOH, $NH_4OH$, or KOH.

13. The method of claim 1, wherein the clay abrasive particles have a particle size such that at least 90% of the particles are in the range of 50 nm to 5 µm.

14. The method of claim 13, wherein the composition further includes a chemical accelerator selected from a peroxide, a sulfate, a persulfate or a nitrate.

15. The method of claim 14, wherein the chemical accelerator is selected from the group consisting of hydrogen peroxide, ammonium persulfate, iron (III) nitrate, and hydroxylamine nitrate.

16. The method of claim 13, wherein the smectite clay has a particle size in the range of 0.05 µm to 5 µm, when slurried in water.

17. The method of claim 16, wherein the smectite clay has a particle size in the range of 0.1 µm to 4 µm, when slurried in water.

18. The method of claim 1, wherein the composition includes at least one additional abrasive particle selected from the group composition of $CeO_2$, silica, alumina, and combinations thereof, each having a particle size such that at least 90% of the particles are in the range of larger than 0.1 µm to 4 µm.

19. A method of planarizing or polishing a corundum, GaAs, GaP or GaAs/GaP alloy surface comprising contacting a surface with a composition comprising (a) a liquid carrier; and (b) 0.1 wt. % to about 90 wt. % of sodium-containing smectite clay abrasive particles, based on the total weight of solids in the composition, wherein about 90% or more of the clay particles (by number) have a particle size in the range of about 0.02 µm to about 20 µm.

20. The method of claim 19, wherein the surface is a memory disk, or a rigid disk surface comprising corundum, GaAs, GaP, or a GaAs/GaP alloy.

21. The method of claim 19, wherein the composition further includes a chemical accelerator selected from a peroxide, a sulfate, a persulfate or a nitrate.

22. The method of claim 19, wherein the chemical accelerator is selected from the group consisting of hydrogen peroxide, ammonium persulfate, iron (III) nitrate, and hydroxylamine nitrate.

23. The method of claim 19, wherein the smectite clay has a particle size in the range of about 0.02 µm to about 10 µm, when slurried in water.

24. The method of claim 23, wherein the smectite clay has a particle size in the range of about 0.05 µm to about 5 µm, when slurried in water.

25. The method of claim 24, wherein the smectite clay is a sodium smectite clay having a particle size in the range of about 0.1 µm to about 4 µm, when slurried in water.

* * * * *